United States Patent [19]

Kataoka

[11] Patent Number: 5,731,240
[45] Date of Patent: Mar. 24, 1998

[54] MANUFACTURING METHOD FOR SEMICONDUCTOR DEPOSITING DEVICE

[75] Inventor: Yuzo Kataoka, Atsugi, Japan

[73] Assignee: Canon Kabushiki Kaisha, Tokyo, Japan

[21] Appl. No.: 416,487

[22] Filed: Apr. 4, 1995

Related U.S. Application Data

[63] Continuation of Ser. No. 917,847, Jul. 23, 1992, abandoned.

[30] Foreign Application Priority Data

Jul. 24, 1991 [JP] Japan .................................. 3-184622

[51] Int. Cl.$^6$ ........................................... H01L 21/331
[52] U.S. Cl. .......................... 438/364; 438/365; 438/366
[58] Field of Search ................................ 438/364, 365, 438/366

[56] References Cited

U.S. PATENT DOCUMENTS

| | | | |
|---|---|---|---|
| 5,010,026 | 4/1991 | Gomi | 437/31 |
| 5,132,234 | 7/1992 | Kim et al. | 437/162 |
| 5,204,274 | 4/1993 | Kanda et al. | 437/31 |
| 5,204,276 | 4/1993 | Nakajima et al. | 437/31 |

FOREIGN PATENT DOCUMENTS

| | | |
|---|---|---|
| 0096155 | 12/1983 | European Pat. Off. . |
| 0263504 | 4/1988 | European Pat. Off. . |
| 0401786 | 12/1990 | European Pat. Off. . |
| 3940394 | 6/1990 | Germany . |
| 60-117772 | 6/1985 | Japan . |
| 1186625 | 4/1970 | United Kingdom . |

OTHER PUBLICATIONS

IBM Technical Disclosure Bulletin, vol. 25, No. 11B, Apr. 1983 "Polysilicon Base–Etched Transistor", pp. 6175–6176 by H.S. Bhatia et al.

Applied Physics Letters, vol. 58. No. 19, May 13, 1991, NY,NY, pp. 2087–2089, by H.W. Lee et al "High deposition rate laser direct writing of Al on Si".

Journal of Applied Physics, vol. 66, No. 6, Sep. 15, 1989, pp. 2395–2401 by A. Kamgar et al "Self–aligned TiN barrier formation by rapid thermal nitridation of $TiSi_2$ in ammonia".

NEC Research and Development No. 90, Jul. 1988, Tokyo, JP pp. 10–13 by H. Takemura et al "BSA technology for sub–100nm deep base bipolar transistors".

Primary Examiner—Tuan H. Nguyen
Attorney, Agent, or Firm—Fitzpatrick, Cella, Harper & Scinto

[57] ABSTRACT

A method of manufacturing a semiconductor device includes the steps of: depositing a semiconductor film onto a semiconductor substrate, the semiconductor film having a main component which is the same material as the semiconductor substrate; and forming a first insulating layer on the semiconductor substrate. This method also includes the steps of: removing predetermined areas from the first insulating layer and the semiconductor film so as to form an opening; forming a second insulating layer inside the opening and on the first insulating layer; and removing the second insulating layer by anisotropic etching so that the side wall of the opening remains.

10 Claims, 3 Drawing Sheets

MANUFACTURING METHOD FOR SEMICONDUCTOR DEPOSITING DEVICE

This application is a continuation of application Ser. No. 07/917,847 filed Jul. 23, 1992, which is now abandoned.

BACKGROUND OF THE INVENTION

1. Field of the Invention

The present invention relates to a semiconductor device. More particularly, it pertains to a method of easily manufacturing in a few steps a miniaturized bipolar transistor in which parasitic elements are reduced, and to a method of easily manufacturing in a few steps a semiconductor device in which such a transistor is incorporated.

2. Related Background Art

With demands for ICs of high speed and high integration, requiring low electric power, there has been an increasing demand that bipolar transistors (BPTs) operate at high speed. To do so, it is important to improve a cut-off frequency $f_T$ and reduce parasitic elements such as junction capacitance and resistance.

Parasitic elements can be reduced by decreasing the number of unnecessary components for operating BPTs as much as possible when the BPTs are miniaturized. Most of the parasitic elements occur because of a margin produced during alignment when a pattern is formed. In connection with miniaturized transistors and the high speed at which they operate, a self-aligned BPT manufacturing technique requiring no other alignment has become very important.

Self-alignment techniques used for Metal-Oxide Semiconductor Transistors (MOSTs) were applied for U.S. patents as application Ser. Nos. 582,053 and 595,163 each filed on Sep. 26, 1966 and Nov. 17, 1966.

Super Self-aligned process Technology (SST) is typically used for manufacturing self-aligned BPTs. The SST is capable of forming, in a single photo-etching step, a base compensation zone, a p+ polysilicon base electrode, a portion where an emitter is in contact with a base, and emitter and base zones which are the most important parts of a transistor. For this reason, when transistors are designed, it is not necessary to allow for errors in aligning approximately four photomasks as necessary in the conventional structure, thus making it possible to easily and controllably manufacture extremely miniaturized transistors. The same lithography technique as that used in the conventional method can be used to reduce the base zone, particularly, the external base zone, to one-fourth to one-fifth of a conventional structure. Thus, parasitic elements, such as base resistance and junction capacitance between the collector and the base, which prevent the transistor from operating at high speed can be reduced proportionally. This permits the transistor to operate at high speed.

With reference to FIGS. 3A to 3C, a description will now be given of a method of manufacturing an npn transistor in accordance with the SST.

An n+ collector zone 32 is formed in a p-type substrate 31. Predetermined areas of the collector zone 32 are etch-removed to form field oxide films 33. An $SiO_2$ film 34 and then a $Si_3N_4$ film 35 are deposited. A non-dope polysilicon layer 36 is formed, and then unnecessary areas of the layer 36 are selectively oxidized to form an $SiO_2$ layer 37.

A p-type impurity is introduced only to the areas of the polysilicon layer 36 that serve as a base electrode so as to form them into p+ polysilicon layer 38. Polysilicon on emitter zones is removed (FIG. 3A). The surface of the p+ polysilicon 38 is oxidized to form an oxide film 39, and then the $Si_3N_4$ film 35 is etched. An appropriate amount of side etching is performed during the above operation. Then the $SiO_2$ film 34 is etched (FIG. 3B). Non-dope polysilicon is formed and then removed by wet etching, thereby embedding polysilicon in the overhanging portions of the p+ polysilicon 38 (FIG. 3C).

A base zone is formed by an ion implanting method, and then an $SiO_2$ film 40, used for preventing shortcircuiting of an emitter/base junction, is formed. Non-dope polysilicon layer 41 is again deposited (FIG. 3D).

A p zone 42 is formed by heat diffusion, and then the polysilicon 41 is dry-etched by anisotropic etching, which is reactive ion etching. The $SiO_2$ film 34 is then removed by dry etching during which polysilicon layer 41A remaining on the side walls of the overhanging portions is used as a mask. A hole in contact with the emitter is formed (FIG. 3E).

A polysilicon layer 43 is deposited on the emitter zones. An n-type impurity is introduced to the polysilicon 43 so that an n+ emitter zone 44 is formed by the diffusion of the impurity. Metal electrodes 45 are then formed (FIG. 3F).

As described above, the miniaturization of transistor and high speed at which the transistor operates are realized by self-aligning the base with the emitter in accordance with the SST.

With the above known method, in the formation steps starting from the base to the emitter, polysilicon layer is deposited three times, $Si_3N_4$ film is deposited twice, resist patterning is performed three times and etching is performed eight times, thus making the manufacturing process complicated and increasing production time.

SUMMARY OF THE INVENTION

The present invention solves the conventional problems, and the object thereof is to provide a method of easily manufacturing a miniaturized transistor in which parasitic elements are reduced, this method requiring only a few steps.

The above object of this invention is achieved by providing a semiconductor device manufacturing method in which vertical a bipolar transistor or a semiconductor including the bipolar transistor is manufactured. This method comprises the steps of: depositing a semiconductor film onto a semiconductor substrate, the semiconductor film having a main component which is the same material as the semiconductor substrate; forming a first insulating layer on the semiconductor substrate; removing predetermined areas from the first insulating layer and the semiconductor film so as to form an opening; forming a second insulation layer inside the opening and on the first insulating layer; and removing the second insulating layer by anisotropic etching so that a side wall portion of the opening remains.

According to the manufacturing method of this invention for the vertical bipolar transistor or the semiconductor device in which the vertical bipolar transistor is incorporated, a wall-shaped insulating material for preventing shortcircuiting between the base and emitter electrodes is formed. The electrode, and base and emitter zones are formed through self-alignment. It is thus possible to form a miniaturized transistor in a short period of time and a few steps in which parasitic elements are reduced.

DETAILED DESCRIPTION OF THE PREFERRED EMBODIMENTS

FIGS. 1A to 1D are sectional views of a semiconductor substrate which illustrate an embodiment of a method of manufacturing a semiconductor device according to the present invention. This invention will be described with reference to the drawings.

Figure 1A:
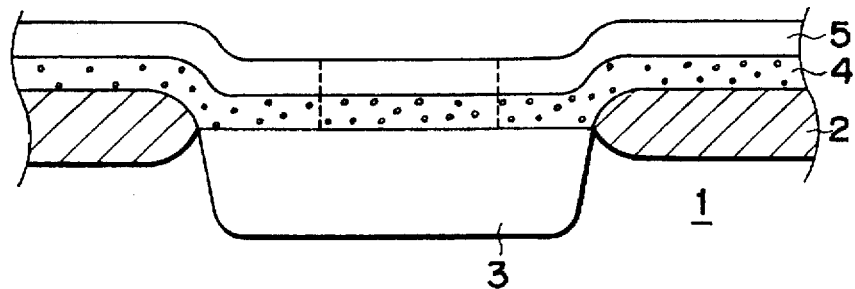
FIGS. 1A to 1D are sectional views of a semiconductor substrate which illustrate the process of manufacturing a bipolar transistor in accordance with an embodiment of the present invention.

A) An electrically-conductive type impurity having properties opposite to those of a semiconductor substrate 1 is introduced in self-alignment by an ion implanting method to an element-forming zone so as to form a base zone 3. The element-forming zone is surrounded by a field oxide film 2 formed by selectively oxidizing a predetermined area of the semiconductor substrate 1. During the above operation the field oxide film 2 is used as a mask. An oxide film which is formed on the element-forming zone to protect it is removed (not shown), and then a polysilicon film 4, which is a semiconductor film, is formed. A desired amount of the same electrically-conductive type impurity as that of the base zone 3 is introduced to the polysilicon film 4. The semiconductor film may be a crystallite or a a—Si or may be grown by the epitaxial method. An oxide film 5 is formed to approximately 6000 Å by the Chemical Vapor Deposition (CVD) technique and then annealed at about 900° C. (FIG. 1A). The base zone may be formed by heat diffusion of doped polysilicon film 4 instead of by ion implantation.

Figure 1B:
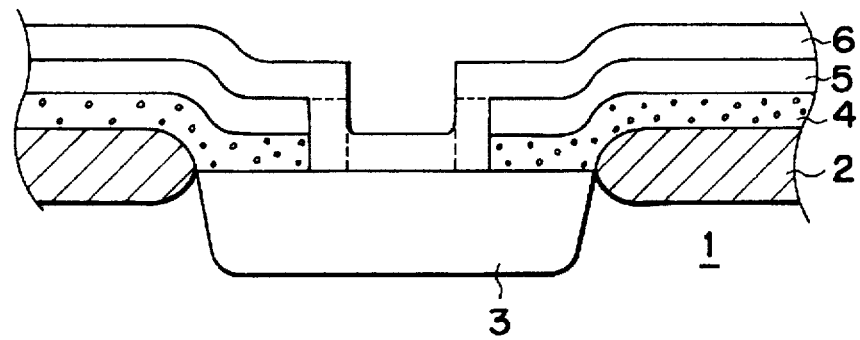

B) Except for the zones of the films 4 and 5 which are used for forming a base electrode, the polysilicon film 4 and the oxide film 5 are etched through resist patterning to form a hole. Then, another oxide film 6 is formed on the oxide film 5 and the hole. It is desirable that the oxide film 6 have a thickness ranging from 0.5 to 1.0 μm, and more desirably, from 0.7 to 0.8 μm (FIG. 1B).

Figure 1C:
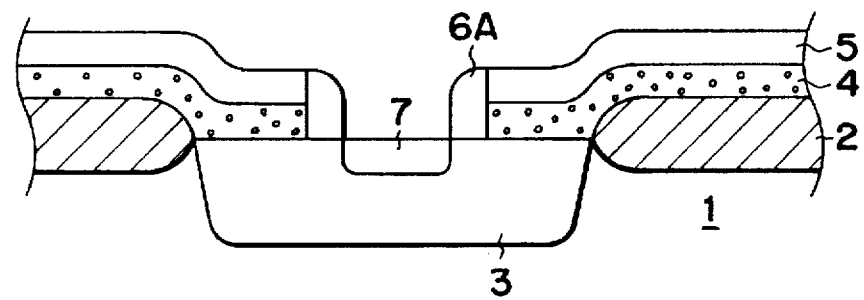

C) The oxide film 6 is etch-backed by anisotropic etching, which is dry etching. Thereby the oxide film 6 is etched only along its length and not along its width. A side wall 6A made of the oxide film is formed on the side of a recess. It is desirable that etching energy, the thickness of the oxide film, etc. be set so as not to etch the base zone. An electrically-conductive type impurity having properties opposite to those of the base zone 3 is introduced by the ion implanting method. During the above operation the side wall 6A is used as a mask. The impurity is activated thermally to form an emitter zone 7 containing a desired amount of impurity (FIG. 1C).

It is preferable that the crosswise thickness of the side wall 6A be of the order of 2000 to 5000 Å to prevent shortcircuiting between the base and emitter electrodes. It is possible to form the emitter zone 7 which is defined by the side wall 6A and has dimensions smaller than those limited by patterning.

Figure 1D:
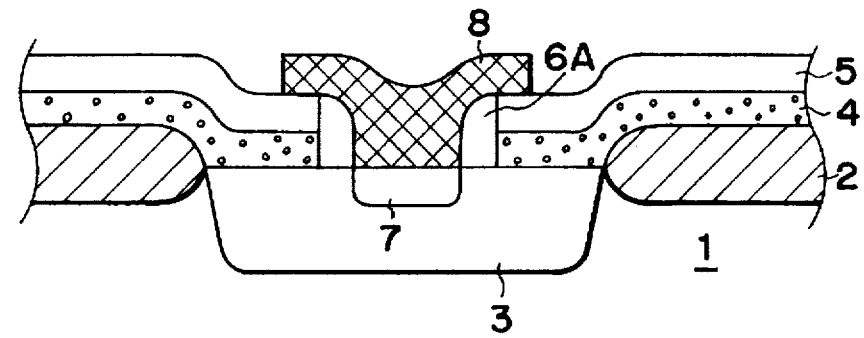

D) An emitter electrode 8 is formed of a material having aluminum as a main component by using, for example, an Al—CVD technique (FIG. 1D). It is particularly preferable that a CVD technique using hydrogen and dimethylaminum hydride be employed to selectively deposit aluminum on the emitter. The emitter electrode may have a two-layer structure in which TiN, TiW, MoSi$_2$ or WSi$_2$ is used to form a barrier metal having a high melting point, and an Al film is formed on the barrier metal. It may also have a three-layer structure in which an Al film is formed on a TiN film which is in turn formed on a TiS$_2$ film. The emitter electrode may also be formed in such a manner that a polysilicon film is formed, and then the same electrically-conductive type impurity as that of the emitter is introduced. Alternatively, the emitter zone 7 may be formed by heat diffusion of the doped polysilicon film instead of by the ion implanting method, and the emitter zone 7 and the emitter electrode 8 may be formed simultaneously.

By using the side wall made of the oxide film in the above way, it is possible to inexpensively manufacture in a few steps a high-performance bipolar transistor in which parasitic elements are reduced, this manufacturing being performed in such a manner that the base is self-aligned with the emitter.

A description will now be given of an example of the manufacturing method of this invention as applied to a Bi—CMOS process.

FIGS. 2A to 2D are sectional views of a substrate which illustrate the manufacturing method as applied to the Bi—CMOS process. The manufacturing method will be described with reference to the drawings.

Figure 2A:
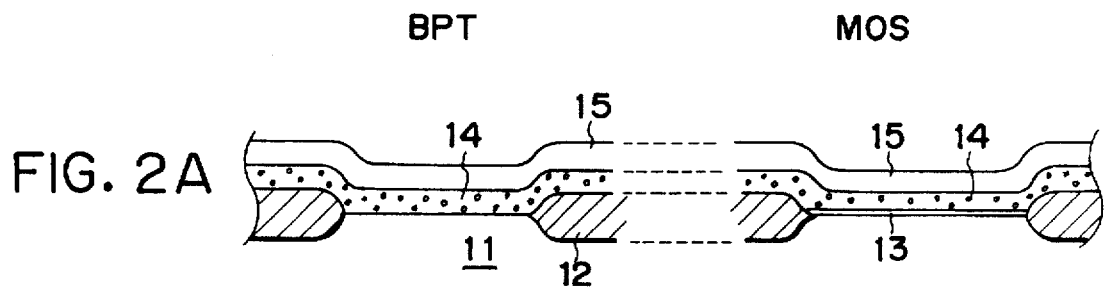
FIGS. 2A to 2D are sectional views of a semiconductor substrate which illustrate the process of simultaneously manufacturing bipolar and MOS transistors in accordance with another embodiment of this invention.

A) A substrate 11 is selectively oxidized to form a field oxide film 12, and then a gate oxide film 13 is formed. The oxide film is removed from a bipolar transistor (BPT) portion to form a polysilicon layer 14 and an oxide film 15 (FIG. 2A). An electrically-conductive type impurity having properties opposite to those of the substrate 11 is introduced to the polysilicon layer 14 during the above operation.

B) An emitter-forming zone and the polysilicon layer 14 and the oxide film 15 in a zone used for preventing short-circuiting between the base and emitter are etched through resist patterning so as to form a hole. At the same time, except for the area of a polysilicon layer 14A which serves as a gate electrode and another oxide film 15A on this layer 14A, the polysilicon layer 14 and the oxide film 15 are etched and removed from a MOS transistor portion (hereinafter referred to as a MOS portion).

As regards the BPT portion, a desired amount of electrically-conductive type impurity having properties opposite to those of the substrate 11 is introduced by the ion implanting method. A base zone 16 is formed by a heat treatment, and a base electrode zone 17 is formed by heat diffusion of the polysilicon layer 14.

Figure 2B:
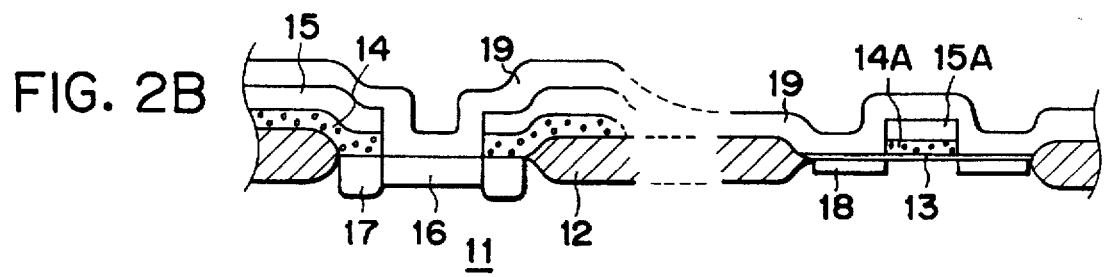

As regards the MOS portion, the oxide film 15A on the gate electrode is used as a mask, and ions are implanted. A low-density dope zone 18 of LDD (lightly doped drain) —MOS is formed by the heat treatment with the aid of the gate oxide film 13. Another oxide film 19 is formed on the entire surface of the substrate (FIG. 2B).

Figure 2C:
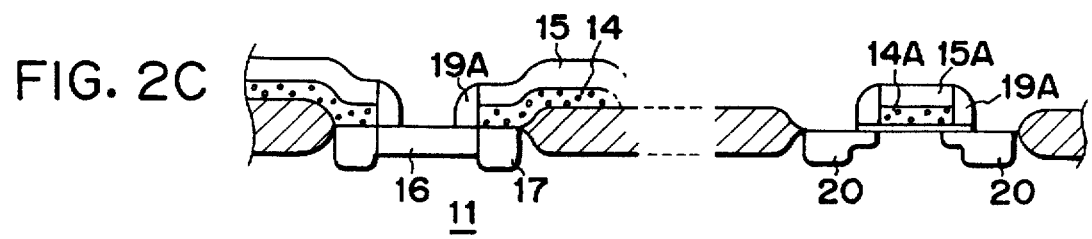

C) The oxide film 19 is etch-backed by anisotropic etching, which is dry etching, to form side walls 19A. A source and a drain 20 used for the MOS portion are formed by the ion implanting method (FIG. 2C).

Figure 2D:
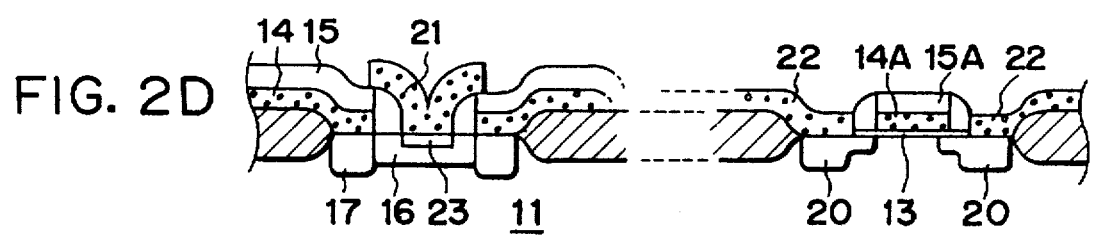
Figure 3A:
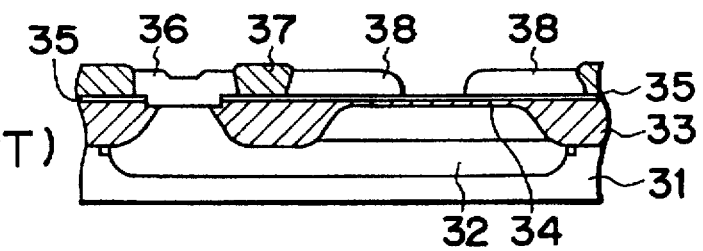
FIGS. 3A to 3F are sectional views of a semiconductor substrate which illustrate the conventional process of manufacturing an npn transistor in accordance with the SST.
Figure 3B:
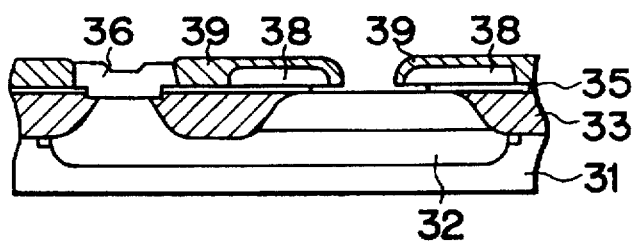
Figure 3C:
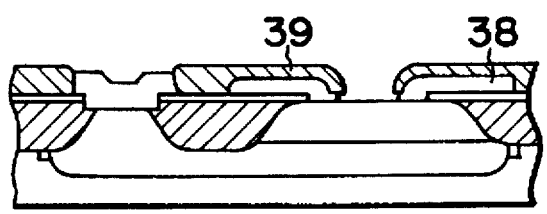
Figure 3D:
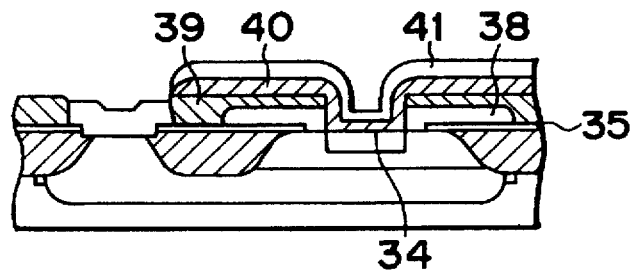
Figure 3E:
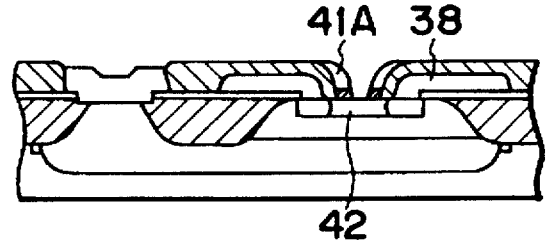
Figure 3F:
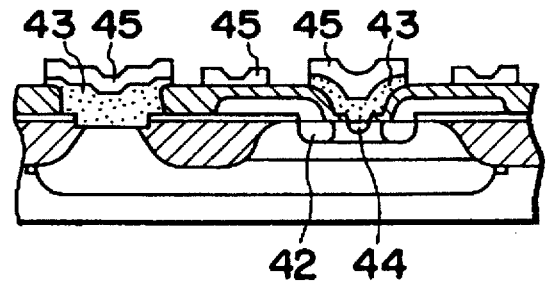

D) Polysilicon layers 21 and 22 are deposited. An electrically-conductive type impurity having properties opposite to those of the base is introduced to the polysilicon 21. An emitter 23 is formed on the BPT portion by heat diffusion of the impurity. At the same time, when the MOS is a PMOS, a p-type impurity is introduced to the polysilicon 22, whereas when it is an NMOS, an n-type impurity is introduced to the polysilicon 22 so as to form the source and drain 20 used as electrodes (FIG. 2D). In this manner, the side walls formed during the process of manufacturing BPTs can be utilized to simultaneously manufacture BPTs and LDD—MOSs in a short period of time.

When ions are implanted in the source and drain of the MOS portion and simultaneously the emitter 23 of the BPT portion is formed in the above step C, the polysilicon 21 and 22 are deposited. An electrically-conductive type impurity having properties opposite to those of the base is introduced to the polysilicon 21 so as to form an emitter electrode. At the same time, when the MOS is a PMOS, a p-type impurity is introduced to the polysilicon 22, whereas when it is an NMOS, an n-type impurity is introduced to the polysilicon 22 so as to form the source and drain 20 used as electrodes (FIG. 2D). Thus, the side walls formed during the process of manufacturing BPTs can be utilized to simultaneously manufacture BPTs and LDD—MOSs in a short period of time.

As has been described above, by providing a wall-shaped insulating material used for preventing shortcircuiting between the base and emitter electrodes, this invention is capable of inexpensively manufacturing, in a short period time and a few steps, a high-performance semiconductor device in which parasitic elements are reduced.

What is claimed is:

1. A method for manufacturing a vertical bipolar transistor, said method comprising the sequential steps of:

forming an insulating zone on a semiconductor substrate and exposing a surface of said substrate;

depositing on said exposed substrate and insulating zone, a semiconductor film having electrically conductive type impurities of a first conductive type and a main component which is the same material as said substrate;

forming a base zone in said semiconductor substrate by thermally diffusing electrically conductive type impurities of said first conductive type from said semiconductor film into said semiconductor substrate;

forming a first insulating layer on said semiconductor film;

removing zones of said first insulating layer and said semiconductor film to form an opening to said base zone;

forming a second insulating layer on said first insulating layer and on the base zone in said opening;

removing said second insulating layer by anisotropic etching to retain said second insulating film on an end surface of said semiconductor film in said opening;

depositing a second semiconductor film on said second insulating layer, in contact with at least the second insulating layer covering said end surface and a surface of said base zone in said opening, said second semiconductor film having a main component which is a material of said semiconductor substrate and which further contains electrically conductive impurities having properties opposite to the base zone; and introducing the impurities from said second semiconductor film into the base zone by thermal diffusion to form an emitter zone.

2. A manufacturing method according to claim 1, wherein the thickness of the second insulating film at an end surface of said semiconductor film ranges from 2000 to 5000 Å.

3. A semiconductor device manufacturing method according to claim 1, wherein said semiconductor film is made of polysilicon.

4. A method for manufacturing a bipolar transistor comprising a base zone, a collector zone, and an emitter zone within a single crystalline silicon semiconductor substrate having a field oxidized film, comprising the sequential steps of:

depositing, in turn, a polysilicon film having impurities for forming the base zone and a first silicon oxide onto said semiconductor substrate;

diffusing impurities contained in said polysilicon film into said semiconductor substrate through thermal diffusion;

forming an opening by removing a zone of each of said deposited polysilicon film and first silicon oxide to expose a surface of said semiconductor substrate;

covering an end surface portion of said first silicon oxide and said polysilicon film defining said opening and said surface of the semiconductor substrate with a second silicon oxide;

etching said second silicon oxide by anisotropic etching to expose said surface of the semiconductor substrate to form an emitter zone, said second silicon oxide covering said end surface of said polysilicon film after etching; and introducing impurities having a different conductive type from the impurities of said polysilicon film using said second silicon oxide as a mask to form the emitter zone.

5. A manufacturing method according to claim 4, further comprising the step of forming an emitter electrode by a metal chemical vapor deposition technique.

6. A manufacturing method according to claim 5, wherein said metal chemical vapor deposition technique is an aluminum chemical vapor deposition technique in which dimethyl aluminum hydride serves as a main raw material gas, wherein said technique is used to deposit the metal layer having Al as a main component.

7. A manufacturing method according to claim 4, wherein the lateral thickness of said second silicon oxide covering the side wall of said first silicon oxide and said polysilicon film ranges from 2,000 to 5,000 Å.

8. A manufacturing method according to claim 4, wherein the introduction of the impurities for forming said emitter zone is performed by ion implanting.

9. A manufacturing method according to claim 4, wherein the introduction of the impurities for forming said emitter zone is performed by heat diffusion from a film having silicon as a main component and an impurity for forming an emitter zone, provided on said emitter zone.

10. A method for manufacturing a vertical bipolar transistor wherein said vertical bipolar transistor has a base, an emitter, and a collector zone, said method comprising the sequential steps of:

preparing a semiconductor substrate of a first conductive type;

depositing a semiconductor film containing impurities of a second conductive type opposite to said first conductive type onto a semiconductor substrate, said semiconductor film having a main component which is the same material as the semiconductor substrate;

forming a base zone by thermally diffusing the impurities of said second semiconductor type from said semiconductor film into said semiconductor substrate;

forming a first insulating layer on said semiconductor substrate;

removing a zone of each of said semiconductor film and said first insulating layer to expose a zone of the base zone of the semiconductor substrate to form an opening;

forming a second insulating layer on the remaining portion of said first insulating layer and on side portions of the semiconductor film and the first insulating layer exposed within said opening;

removing a part of said second insulating layer by anisotropic etching to provide a cover of second insulating layer on said side portions of the semiconductor film and first insulating layer;

forming an emitter zone by implanting ions into the exposed zone of the semiconductor substrate using said second insulating layer as a mask; and forming an emitter electrode connected to said emitter zone, said emitter electrode having a laminated structure composed of metal having a high melting point and another metal having aluminum as a main component.

* * * * *

UNITED STATES PATENT AND TRADEMARK OFFICE
CERTIFICATE OF CORRECTION

PATENT NO. : 5,731,240

DATED : March 24, 1998

INVENTOR(S) : YUZO KATAOKA

It is certified that error appears in the above-identified patent and that said Letters Patent is hereby corrected as shown below:

COLUMN 1

Line 11, "facturing in a few steps" should read
        --facturing, in a few steps,--;
    Line 12, "reduced, and" should read
        --reduced. It also pertains--;
    Line 16, "demands" should read --demand-- and
        "ICs" should read --integrated circuits (ICs)--;
    Line 31, "for" should read --for in--;
    Line 32, "ents as" should read --ent--;
    Line 42, "as" should read --as was-- and
        "structure," should read --structure.--;
    Line 43, "thus making it" should read --Thus it is--; and
    Line 58, "non-dope" should read --non-doped--.

COLUMN 2

Line 1, "Non-dope" should read --Non-doped--;
    Line 20, "high" should read --the high--;
    Line 37, "vertical a" should read --a vertical--; and
    Line 57, "steps" should read --steps,--.

UNITED STATES PATENT AND TRADEMARK OFFICE
CERTIFICATE OF CORRECTION

PATENT NO. : 5,731,240
DATED : March 24, 1998
INVENTOR(S) : YUZO KATAOKA

It is certified that error appears in the above-identified patent and that said Letters Patent is hereby corrected as shown below:

COLUMN 5

Line 10, "period" should read --period of--; and
    Line 49, "semiconductor device" should be deleted.

Signed and Sealed this

Fifth Day of January, 1999

Attest:

Attesting Officer      *Acting Commissioner of Patents and Trademarks*